United States Patent
Desai et al.

(10) Patent No.: US 8,976,607 B2
(45) Date of Patent: Mar. 10, 2015

(54) HIGH-SPEED MEMORY WRITE DRIVER CIRCUIT WITH VOLTAGE LEVEL SHIFTING FEATURES

(71) Applicant: QUALCOMM Incorporated, San Diego, CA (US)

(72) Inventors: Nishith Desai, San Diego, CA (US); Rakesh Vattikonda, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 13/784,830

(22) Filed: Mar. 5, 2013

(65) Prior Publication Data

US 2014/0254293 A1    Sep. 11, 2014

(51) Int. Cl.
  *G11C 16/04* (2006.01)
  *G11C 7/10* (2006.01)
  *G11C 11/417* (2006.01)
  *G11C 7/22* (2006.01)

(52) U.S. Cl.
  CPC ........... *G11C 7/1096* (2013.01); *G11C 7/1006* (2013.01); *G11C 7/22* (2013.01); *G11C 7/1078* (2013.01); *G11C 2207/2227* (2013.01); *G11C 11/417* (2013.01)
  USPC ............ 365/189.16; 365/189.05; 365/189.11; 365/230.06; 365/191

(58) Field of Classification Search
  CPC ....... G11C 7/1078; G11C 7/22; G11C 7/1006
  USPC ............ 365/189.16, 189.11, 189.05, 230.06, 365/191
  See application file for complete search history.

(56) References Cited

U.S. PATENT DOCUMENTS

| | | | |
|---|---|---|---|
| 7,085,173 | B1 | 8/2006 | Bunce et al. |
| 7,417,911 | B2 * | 8/2008 | Kuroda .......................... 365/203 |
| 7,990,755 | B2 * | 8/2011 | Kim ................................ 365/149 |
| 8,199,559 | B2 | 6/2012 | Kajigaya |
| 8,203,898 | B2 | 6/2012 | Campbell et al. |
| 8,238,183 | B2 * | 8/2012 | Yoshida et al. ................ 365/207 |
| 8,279,687 | B2 * | 10/2012 | Adams et al. ............. 365/189.11 |
| 8,553,476 | B2 * | 10/2013 | Yan et al. .................. 365/189.16 |
| 2012/0002492 | A1 | 1/2012 | Choi |
| 2012/0155145 | A1 | 6/2012 | Kim |
| 2012/0206987 | A1 | 8/2012 | Dreesen |

* cited by examiner

*Primary Examiner* — Connie Yoha
(74) *Attorney, Agent, or Firm* — Novak Druce Connolly Bove + Quigg LLP

(57) ABSTRACT

Various aspects of a fast, energy efficient write driver capable of efficient operation in a dual-voltage domain memory architecture are provided herein. Specifically, various aspects of the write driver described herein combine a high speed driver with voltage level shifting capabilities that may be implemented efficiently in reducing use of silicon area while using lower power. The write driver circuit shifts or adjusts voltage levels between a first voltage domain to a second voltage domain. In one example, the write driver circuit is coupled to a global write bitline and a local write bitline that is coupled to one or more bitcells (of SRAM memory). The write driver circuit converts a first voltage level at the global write bitline to a second voltage level at the local write bitline during a write operation.

36 Claims, 9 Drawing Sheets

| Operation Mode | wclk | gwbl | gwblb | lwbl | lwblb |
|---|---|---|---|---|---|
| standby | 0 | 0 | 0 | floating@vddH/2 | floating@vddH/2 |
| write | 1 | 1 | 0 | 1 | 0 |
| | 1 | 0 | 1 | 0 | 1 |

HIGH-SPEED MEMORY WRITE DRIVER CIRCUIT WITH VOLTAGE LEVEL SHIFTING FEATURES

BACKGROUND

1. Field

Aspects of the present disclosure relate generally to memory devices, and more particularly, to a high-speed memory write driver circuit with voltage level shifting features.

2. Background

Power conservation for memory devices is a major objective in almost all modern electronics due to such design considerations as length of run-time as well as scalability. Many approaches have been proposed to attempt to reduce energy expenditure because memory write access may consume more than 50% of dynamic power. Further, in memory device architectures that utilize pre-charged write bitlines, wasting energy through higher leakage power is often unavoidable.

To reduce memory device power consumption, modern memory device architectures typically incorporate local write drivers to segment write bitlines hierarchically into global and local write bitlines. Global write bitlines are referred to as such because they are coupled to banks of write drivers, where each bank of write drivers includes a write driver to write to a set of bitcells using local write bitlines. In other words, in a most basic version of the modern memory device architecture, bitcells that make up memory storage are grouped into banks of memory. Each bank of memory may be programmed using a driver for driving write data to a pair of local bitlines that is coupled to each bitcell in that bank, with a decoder that is used to select which bitcell is to be programmed with the data on the local bitline. Write data is delivered to a respective write driver for the local bitlines of each bank using a single set of global bitlines.

The use of global and local bitlines allows the use of two voltage domains: a high voltage domain for the local bitlines that is needed to program the bitcells, and a low voltage domain for the global bitlines that allows data to be transferred over long distances using a lower voltage, which equates to lower power consumption. Although the described approach of using local write bitlines with associated drivers allows the two domains to be created, local write drivers increase delay because they are typically slow. For example, a 2-3 gate delay is typically incurred during a critical transition of a local bitline going low. Additional gates are also necessary to implement local write drivers, which consume precious silicon area.

Further, a level shifter must typically be used to shift the voltage level of the pair of global write bitlines to match the voltage level of the pair of local write bitlines to avoid bitcell short circuit current during write operations caused by the difference in voltage levels in the two domains. As such, all appropriate bitlines need to be setup before a write operation is activated. Thus, conventionally, when level shifters are used, the penalty incurred from the additional use of silicon area and speed reduction may be extremely high.

In order to be able to reduce power consumption while being able to maintain a dual-voltage domain memory architecture with minimal cost in space and/or operational speed, other approaches are desired.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of a high speed write driver with level shifting capabilities are described herein. The write driver is configured to receive a global data write signal at a first voltage and provide a local write data signal at a second, higher voltage and capable of doing so at high speeds. The write driver is also configured to perform these operations efficiently and may be implemented using a reduced amount of space as compared with conventional write drivers.

In one aspect, the disclosure provides a memory data write circuit that includes a level shifter portion/circuit configured to receive a first data write signal from a first voltage domain and output a second data write signal in a second voltage domain; and a write driver portion/circuit coupled to the level shifter portion/circuit and a plurality of memory bitcells through at least one local bitcell line, wherein the write driver portion/circuit is configured to selectively provide the second data write signal on the at least one local bitcell line during a write operation.

In another aspect, the disclosure provides an apparatus including means for level shifting a first data write signal received from a first voltage domain to output a second data write signal in a second voltage domain; and means for selectively providing the second data write signal to a plurality of memory bitcells through at least one local bitcell line coupled to the means for level shifting during a write operation.

In yet another aspect, the disclosure provides an apparatus for wireless communication that includes at least one processing circuit and a memory coupled to the at least one processing circuit, where the memory includes a memory data write circuit. The memory data write circuit includes a level shifter portion/circuit configured to receive a first data write signal from a first voltage domain and output a second data write signal in a second voltage domain; and a write driver portion/circuit coupled to the level shifter portion/circuit and a plurality of memory bitcells through at least one local bitcell line, wherein the write driver portion/circuit is configured to selectively provide the second data write signal on the at least one local bitcell line during a write operation.

In yet another aspect, the disclosure provides a method of communication that includes receiving a first data write signal from a first voltage domain for output of a second data write signal in a second voltage domain; and selectively providing the second data write signal on at least one local bitcell line during a write operation.

These and other aspects of the invention will become more fully understood upon a review of the detailed description, which follows.

BRIEF DESCRIPTION OF THE DRAWINGS

These and other sample aspects of the disclosure will be described in the detailed description that follow, and in the accompanying drawings.

FIG. 4 is a tabulation of signal values that may be used to describe the operation of the standby and write modes of the write driver of FIG. 2.

Figure 1:
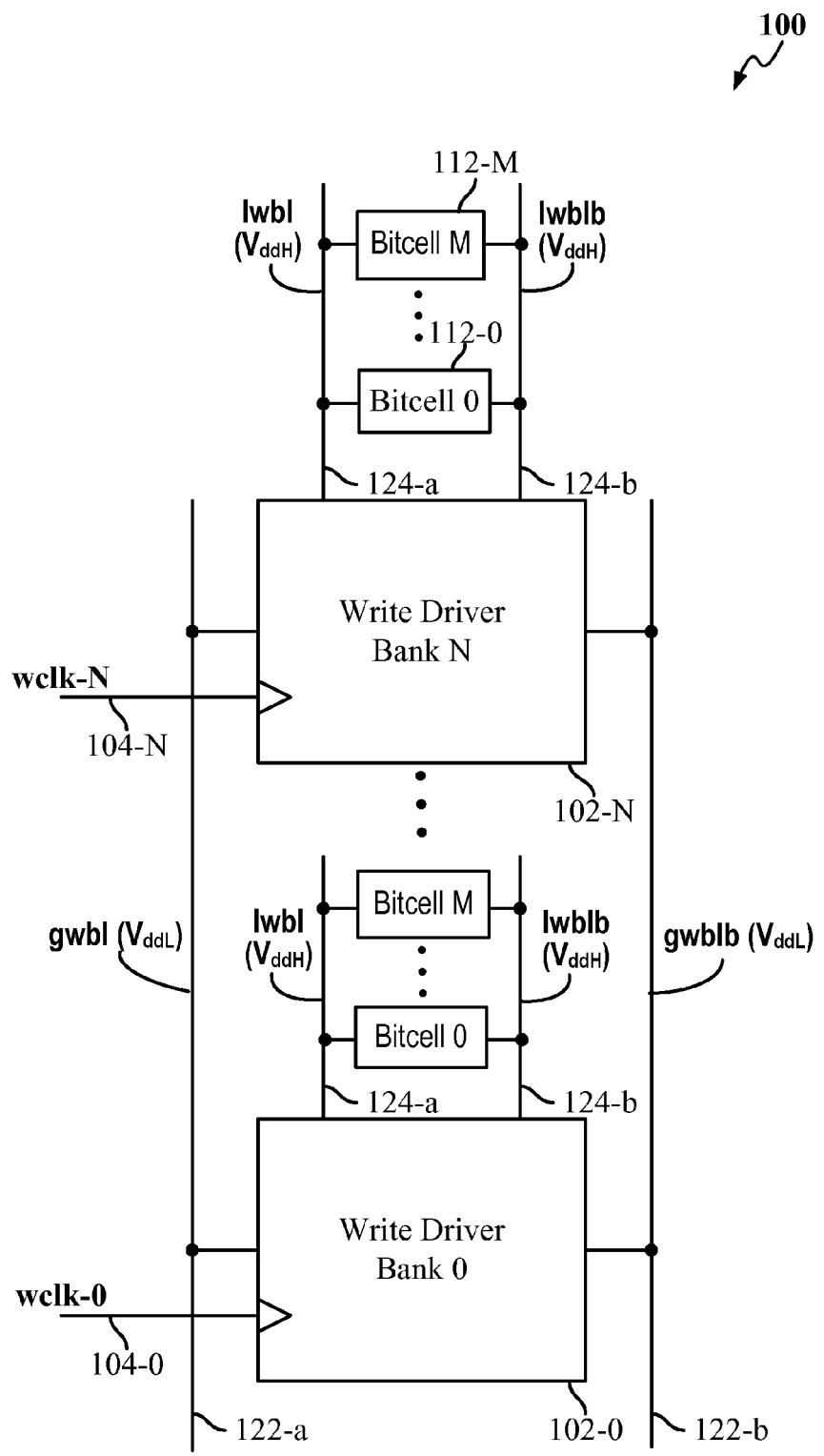
FIG. 1 is a block diagram illustrating an example of a dual-voltage domain memory architecture to which various aspects of the disclosed approach may be applied.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

FIG. 1 illustrates a memory subsystem 100 as an example of a dual-voltage domain memory architecture that includes a pair of global write bitline (gwbl) and global write bitline bar (gwblb) signal lines 122-a,b, which may be referred to as "gwbl/gwblb signal lines" in general, for coupling write data received from a periphery logic (not shown) to a plurality of local write drivers. The plurality of local write drivers may be illustrated as "Write Driver Bank 0" to "Write Driver Bank N" in a set of write drivers 102-0,N that also receive respective individual write clocks signals. These write clock signals are illustrated as "wclk-0" to "wclk-N" as a set of write clock signals 104-0,N. Each local write driver in the set of write drivers 102-0,N is coupled to a respective pair of local write bitline (lwbl) and local write bitline bar (lwblb) signal lines 124a,b, which may be referred to herein as "lwbl/lwblb signal lines" in general, for performing write operations of received data to a bank of bitcells. An example bank of bitcells is illustrated as "Bitcell 0" to "Bitcell M" as a set of M-bitcells 112-0,M. In an attempt to reduce unnecessary complexity in the description, the memory subsystem 100 may also include other circuitry that typically is needed to form any memory core but which is not shown or discussed herein, including bitcell power supply and write clock (wclk) logic.

As detailed in FIG. 1, a pair of gwbl/gwblb signal lines 122a,b, and two pairs of lwbl/lwblb signal lines 124a,b are separately located in two different voltage (Vdd) domains: a low voltage domain (operating at a lower voltage VddL) for the bitlines gwbl/gwblb 122a,b; and a high voltage domain (operating at a higher voltage VddH) for the bitlines lwbl/lwblb 124a,b. As noted, using a lower voltage domain enables reduced power consumption as the low voltage domain operates at a lower voltage VddL, and thereby lower power, than the high voltage domain. Consequently, the system as a whole is not required to operate at the higher voltage VddH of the high voltage domain. Although the set of write drivers 102-0,N allows the two distinct voltage domains to be created, use of separate write drivers typically creates a 2-3 gate delay that is typically incurred during a critical transition of a bitline going low. Typically, additional gates are also necessary to implement local write drivers, which consume precious silicon area.

Further, due to the difference in voltage levels in the two domains (e.g., VddL and VddH), a level shifter is used to shift the voltage level of the gwbl/gwblb signal lines 122-a,b to match the voltage level of the high voltage domain to avoid bitcell short circuit current during write operations. As such, appropriate bitlines need to be setup before the wclk lines are activated. Moreover, when conventional level shifters are used, a penalty from the additional use of area used to implement the level shifters and hit in speed may be high.

Various aspects of the fast, energy efficient write driver with built-in level shifter design configured in accordance with the disclosed approach are described herein, and are illustrated in the following figures.

Figure 2:
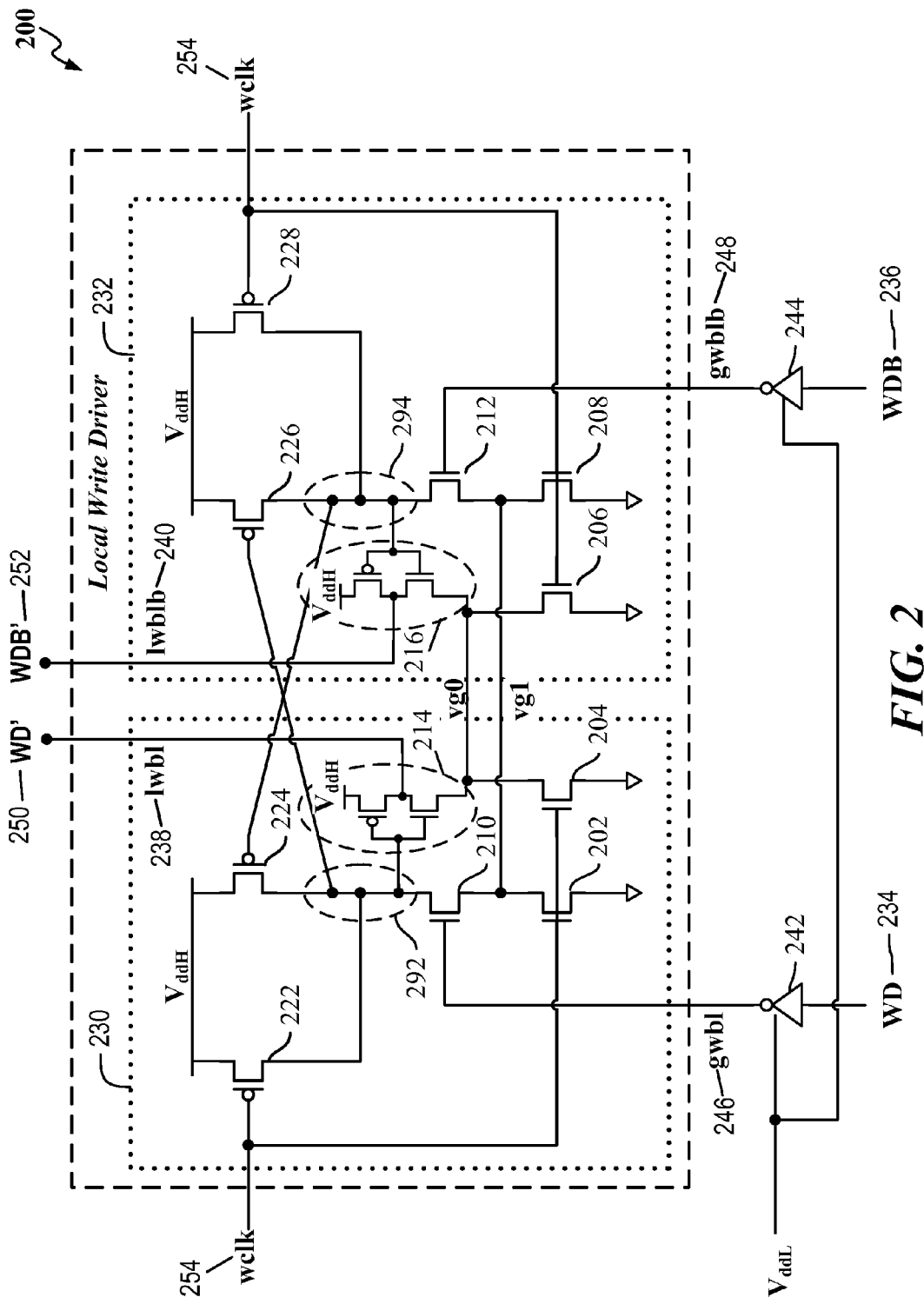
FIG. 2 is a block diagram illustrating a write driver with level-shifting capabilities configured in accordance with various aspects of the disclosed approach that may be utilized to address many issues in the dual-voltage domain memory architecture of FIG. 1.

FIG. 2 is a block diagram illustrating a write driver with level-shifting capabilities configured in accordance with various aspects of the disclosed approach that may be utilized to address many issues in the dual-voltage domain memory architecture of FIG. 1. In one example, each of the write drivers 102-0,N in FIG. 1 may be implemented as a write driver 200 in FIG. 2. The write driver 200 may be adapted to receive data over global write bitlines (gwbl/gwblb) operating at a first voltage level (e.g., first voltage domain or low voltage domain VddL) and output the data over local write bit lines (lwbl, lwblb) operating at a second voltage level (e.g., second voltage domain or high voltage domain VddH). The write driver 200 may include two driver sub-circuits 230 and 232, which take as inputs a write data (WD) signal 234 and a write data bar (WDB) signal 236 and output a voltage-shifted, voltage-conditioned, or voltage-modified version of the conditioned WD' signal 250 and WDB' signal 252 over a local write bitline (lwbl) 238 and local write bitline bar (lwblb) 240, respectively. For instance, a first driver sub-circuit 230 may receive the WD signal 234 on a global write bitline (gwbl) 246, conditions a voltage level of the WD signal 234 (e.g., from a first voltage level to a second voltage level), and outputs the conditioned WD' signal 250 over the lwbl 238. Similarly, a second driver sub-circuit 232 may receive the WDB signal 236 on a global write bitline bar (gwblb) 248, conditions a voltage level of the WDB signal 236 (e.g., from a first voltage level to a second voltage level), and outputs the conditioned WDB' signal 252 over the lwblb 240. The lwbl 238 and lwblb 240 may be coupled to one or more bitcells (as illustrated in FIG. 1). Similarly, the gwbl 246 and gwblb 248 may be coupled one or more write drivers (as illustrated in FIG. 1). In one example, the gwbl 246 and gwblb 248 both operate as the same first voltage level (VddL) which is less than a second voltage level (VddH) at which the lwbl 238 and lwblb 240 operate.

The write driver 200 may thus include a level shifter portion or circuit configured to receive a first data write signal (WD 234 and/or WDB 236) in a first voltage domain (e.g., at a first voltage level VddL) and output a second data write signal (WD' 250 and/or WDB' 252) in a second voltage domain (at a second voltage level VddH). The level shifter portion or circuit may condition, modify, or shift the voltage level of the first data write signal (WD 234 and/or WDB 236) from a first voltage level (VddL) to a second voltage level (VddH). In one embodiment, the level shifter portion or circuit may include the transistors 210, 212 that are coupled to receive signals (WD 234 and/or WDB 236) from a pair of first data write signal lines (e.g., gwbl 246 and/or gwblb 248) at a first voltage domain (e.g., VddL) and output signals (WD' 250 and/or WDB' 252) on the pair of second data write signal lines (e.g., lwbl 238 and/or lwblb 240) in a second voltage domain (e.g., VddH) using a pair of inverter stack 214, 216.

The write driver 200 may also include a write driver portion or circuit coupled to the level shifter portion or circuit and a plurality of memory bitcells through at least one local bitcell line (lwbl 238 and/or lwblb 240), wherein the write driver portion or circuit is configured to selectively provide the second data write signal (WD' 250 and/or WDB' 252) on the at least one local bitcell line (lwbl 238 and/or lwblb 240) during a write operation. The write driver portion or circuit may include transistors 222, 228 that are coupled to a write enable signal line (wclk) and allow the write driver 200 to operate based on the wclk signal line input. The write driver portion or circuit selectively provides the data write signal WD 234 and/or WDB 236 on at least one local bitcell line (lwbl 238 and/or lwblb 240) during a write operation based on the write enable signal (wclk). In one embodiment, this write driver portion or circuit may also include NMOS (n-channel metal-oxide-semiconductor) footer transistors 202, 204, 206, and 208 that allow the pair of lwbl 238 and/or lwblb 240 signal lines to be held to a respective rail based on values of the pair of gwbl/gwblb 246 and/or 248 signal lines.

In one example, the write driver portion or circuit may include first transistors 222, 228 (e.g., p-channel metal-oxide-semiconductor field-effect PMOS transistors) whose gates receive the wclk signal 254, their source is coupled to a second supply voltage (second voltage level VddH). Gate transistors 224, 226 (e.g., PMOS transistors) have their source coupled to the second supply voltage (second voltage level VddH), the drains of the first transistors 222, 228 and gate transistors 224, 226 are coupled together at corresponding nodes 292, 294, respectively. Gate transistors 224, 226 have their gates cross-coupled, with the gate of transistor 226 coupled to first node 292 (which is also coupled to the drain of transistor 224), and the gate of transistor 224 coupled to second node 294 (which is also coupled to the drain of transistor 226).

The level shifter portion or circuit may include second transistors 210, 212 (e.g., NMOS transistors) have their source coupled to the corresponding nodes 292, 294, respectively, and their source coupled to the gwbl 246 and gwblb 248, respectively. A pair of inverter stack transistors 214, 216 (e.g., formed using a PMOS transistor in series with an NMOS transistor) have one end coupled to the second supply voltage VddH and their gates coupled to the nodes 292, 294, respectively. The lwbl line 238 and lwblb line 240 are coupled between the PMOS transistor and NMOS transistor of the inverter stack transistors 214, 216, respectively. A first pair of footer transistors 202, 208 (e.g., NMOS transistors) have their sources coupled second transistors 210, 212, respectively, their gates are coupled to the write enable line to receive the wclk signal 254, and their drains coupled to ground. A second pair of footer transistors 204, 206 have their transistor sources coupled to the drains of the inverter stack transistors 214, 216, respectively, and their gates are coupled to the write enable line to receive the wclk signal 254. The drains of the inverter stack transistors 214, 216 are also coupled together as are the drains of the second transistors 210, 212. This allows the pair of lwbl/lwblb signal lines 238, 240 to be held to a respective rail based on values of the pair of gwbl/gwblb signal lines 246, 248. A pair of inverters 242, 244 along the along the gwbl line 246 and gwblb line 248 are coupled to a first supply voltage VddL.

According to one at least one set of stacked inverter transistors comprising a PMOS transistor coupled in series to an NMOS transistor with the at least one local bitcell line coupled between the PMOS transistor and the NMOS transistor, the at least one set of inverter transistors having one end coupled to a power supply voltage (VddH) and a second end selectively coupled to ground via a footer transistor, wherein the footer transistor selectively enables or disables a path between the at least one set of stacked inverter transistors and ground depending on a state of the write clock line.

According to one aspect, the write driver circuit may be configured to allow the at least one local bitcell line (e.g., lwbl 238 and/or lwblb 240) to remain in a floating state. The write driver circuit may further coupled to a write clock line (e.g., wclk 254) and configured to allow the at least one local bitcell line (e.g., lwbl 238 and/or lwblb 240) to remain in the floating state when the write clock line is inactive. For instance, a first set of stacked inverter transistors (e.g., first inverter stack 214) may have a first local bitcell line (e.g., lwbl 238) coupled between a first PMOS transistor and a first NMOS transistor. Similarly, a second set of stacked inverter transistors (e.g., second inverter stack 216), with a second local bitcell line (lwblb 240) coupled between a second PMOS transistor and a second NMOS transistor. The second ends of the first set of stacked inverter transistors and second set of stacked inverter transistors are coupled together (e.g., vg0) to achieve charge sharing between the first and second sets of stacked inverter transistors (e.g., first and second inverter stack 214, 216).

Figure 3:
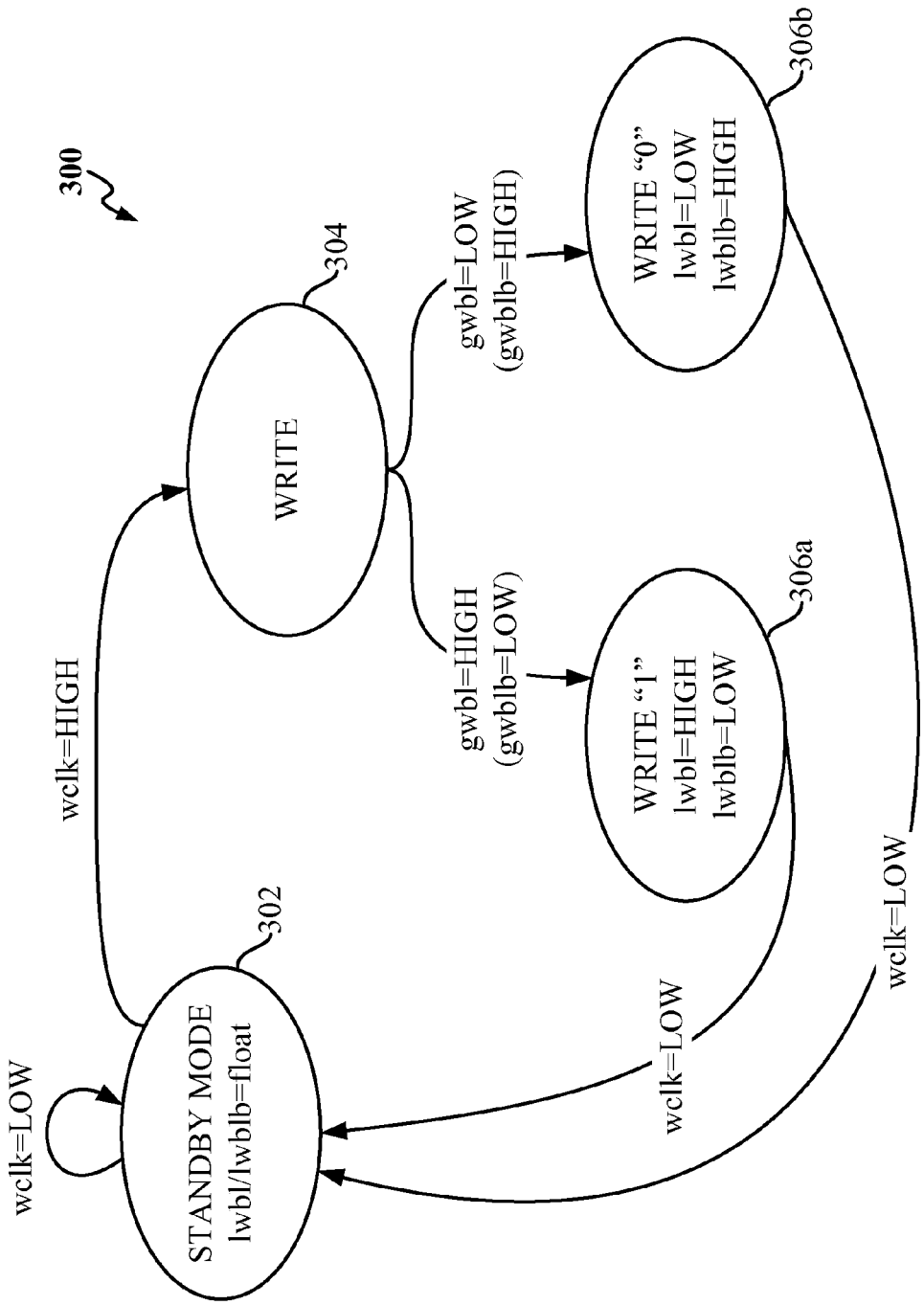
FIG. 3 is a state diagram that may be used to describe the operation of the write driver of FIG. 2 in standby and write modes.

Operation of the write driver 200 in FIG. 2 may be described using a state diagram 300 of FIG. 3. Further, FIG. 4 includes a table 400 that is a value table of values for various modes of operation of the write driver 200, including standby and write modes, where "wclk" 254 is a write clock value on the write clock line; "gwbl/gwblb" are respective values on the pair of gwbl/gwblb signal lines 246, 248; and, "lwbl/lwblb" are local write bitline and local write bitline bar values, respectively, for a pair of lwbl/lwblb signal lines 238, 240. The operation of the write driver 200 may be described using the state diagram 300 of FIG. 3, with reference to FIG. 2 and the table 400.

At 302, in a standby mode, signals on the pair of wclk lines to transistors 222 and 228 may be held low, and the pair of gwbl/gwblb signal lines coupled to transistors 210 and 212 may be pre-charged to ground (GND). The pair of lwbl/lwblb signal lines, each of which is coupled to a respective inverter stack 214, 216 formed using p-channel metal-oxide-semiconductor field-effect (PMOS) and n-channel MOS (NMOS) transistors, may also remain floating during the standby mode because of isolation provided by transistors 202, 204, 206, and 208. Specifically, because the transistors 202, 204, 206, and 208 are off as their gates, all of which are coupled to the wclk signal lines, are held low during the standby mode, no current may flow through them to GND. In one aspect of the disclosed approach, the voltage level at any floating node is VddH/2, which allows the node to be brought to either rail more quickly than if the node was at an opposite rail. The floating configuration provides for lower power consumption while maintaining high speed writeability by the write driver 200.

At 304, the write driver 200 may be operated in a write mode that may be described as a write cycle for writing a "1" or a "0" in a bitcell. Generally, at a beginning portion of the write cycle, one of the pair of gwbl/gwblb signal lines is pulled high to VddL while the other is pulled low to GND, and the wclk line is enabled high to VddH. As a result, each one of the pair of lwbl/lwblb signal lines is accordingly pulled to an opposing rail through a corresponding one of the inverter stacks 214, 216.

At 306a, in the example illustrated in table 400 for signaling a "1" on the lwbl signal line, the gwbl signal line to transistor 210 is brought high to VddL and the gwblb signal line to transistor 212 is held low at GND. Consequently, the lwblb signal line is brought low to GND by the inverter stack 216 while the lwbl signal line is brought high to VddH by the other inverter stack 214. In one aspect of the disclosed approach, write data/write data bar (WD/WDB) signals are coupled to the gwbl/gwblb signal lines through a respective pair of inverters 242 and 244. A mirror of the operation to signal a "1" on the lwbl signal line (and a "0" on the lwblb signal line) may be performed to signal a "0" on the lwbl signal line (and a "1" on the lwblb signal line) at 306b. Thus, depending on the value of the received WD/WDB, either a "1" or a "0" may be driven on the lwbl signal line, with the inverse driven on the lwblb signal line.

In one aspect of the disclosed approach, cross-coupled PMOS feedback, as illustrated by a cross-coupling of a respective gate of transistors 224 and 226 to nodes 294, 292 in FIG. 2, prevents any fighting/DC current. Further, through the use of NMOS footers made up of the transistors 202, 204, 206, and 208, as shared between the two write drivers (vg0 and vg1), the speed at which the write driver 200 may initiate a write operation for a memory bitcell is not compromised.

Figure 5:
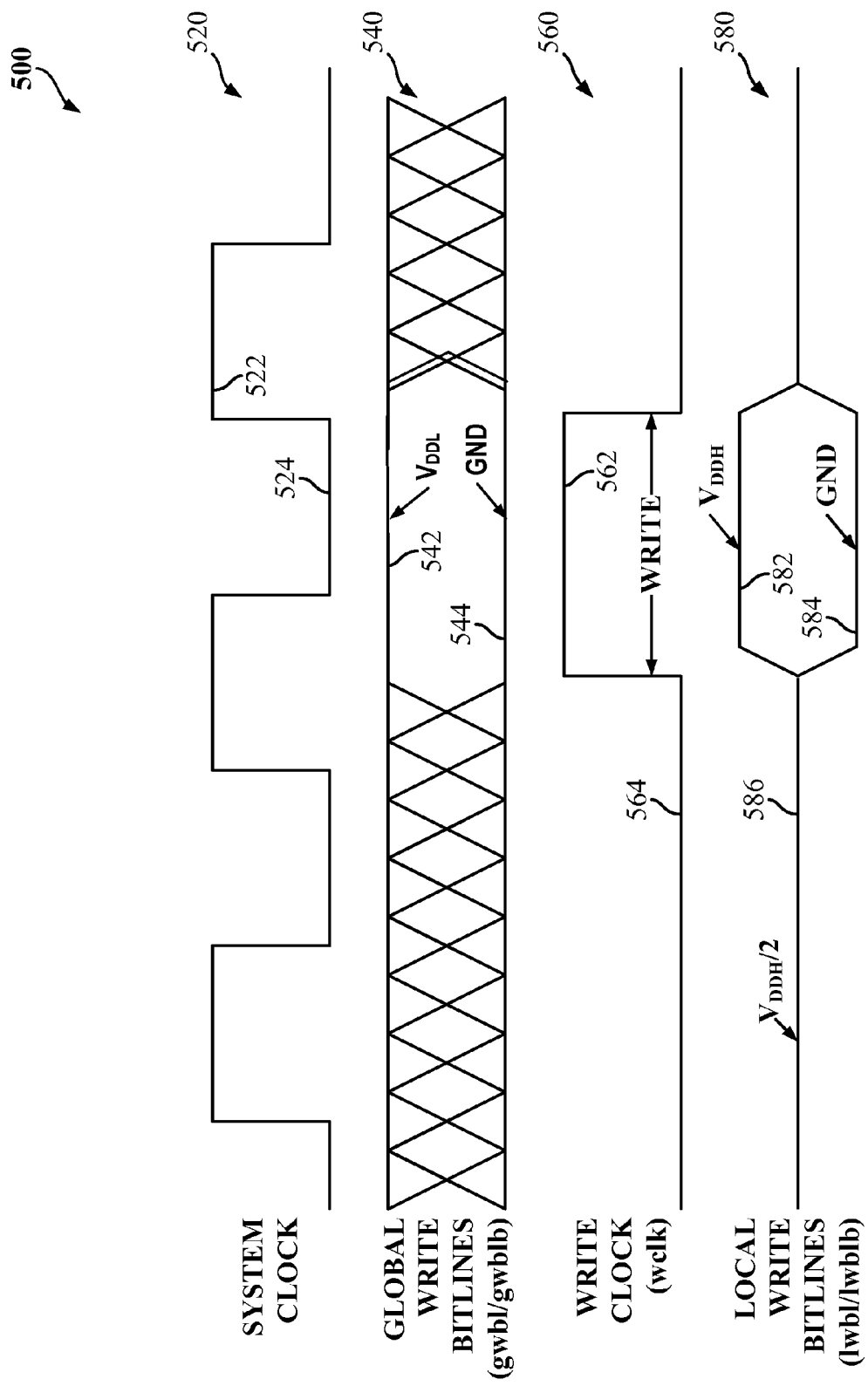
FIG. 5 is a timing diagram that may be used to describe the operation of the standby and write modes of the write driver of FIG. 2.

FIG. 5 illustrates a timing diagram 500 illustrating signal values of various portions or sub-circuits of the write driver 200 during the standby and write modes of the write driver 200, including: a system clock signal line waveform 520; a pair of global write bitlines (gwbl/gwblb) signal line waveforms 540 (e.g., WD/WDB waveforms input into the write driver 200); a write clock (wclk) signal line waveform 560; and a pair of local write bitlines (lwbl/lwblb) signal line waveforms 580 (e.g., WD'/WDB' waveforms output from the write driver 200). The system clock signal line waveform 520 may be a timing signal typically generated by a timer to drive the operation of the write driver 200 and the rest of the circuit in the system that includes a clock high portion 522 and a clock low portion 524.

As illustrated by the pair of lwbl/lwblb signal line waveforms 580, it may be seen that the pair of lwbl/lwblb signal lines remain floating at a level VddH/2 586 until a write operation occurs. As discussed above, allowing the pair of lwbl/lwblb signal lines to float reduces consumption of power by the write driver 200 because no power is expended to maintain these signal lines at a particular value. Further, allowing the pair of lwbl/lwblb signal lines to float allows the write driver 200 to remain responsive to write operations.

During each write operation, the wclk signal line waveform 560 transitions from a low value 564 to a high value 562, which allows respective values 542, 544 (e.g., voltage level VddL and ground), as shown on the gwbl/gwblb signal line waveforms 540, that reach the transistors 210 and 212, to be reproduced on the lwbl/lwblb signal lines. Specifically, values on respective lwbl/lwblb signal lines as shown on the lwbl/lwblb signal line waveforms 580 are brought to levels 582 and 584 (e.g., voltage level VddL and ground) to match the state on the gwbl/gwblb signal lines. At other times, the gwbl/gwblb signal lines may be left inactive, as illustrated by cross-hatched portions in the gwbl/gwblb signal line waveforms 540.

In one aspect of the disclosed approach, power saving results from the fact that, for a desired write operation for a bitcell of interest, only the write driver bank of the bitcell of interest needs to be active. For example, only the write driver bank 102-N for the set of write driver banks 102-0,N needs to be active during a write operation to a bitcell such as the bitcell 112-M in the set of bitcells 112-0,M. As such, global write bitlines are configured to operate at a lower voltage such that less dynamic power is consumed because capacitance is lower in in this domain. Further, the configuration of the local write bitlines in accordance with various aspects of the disclosed approach allow use of the least amount of power at the higher voltage level of the local domain.

Figure 6:
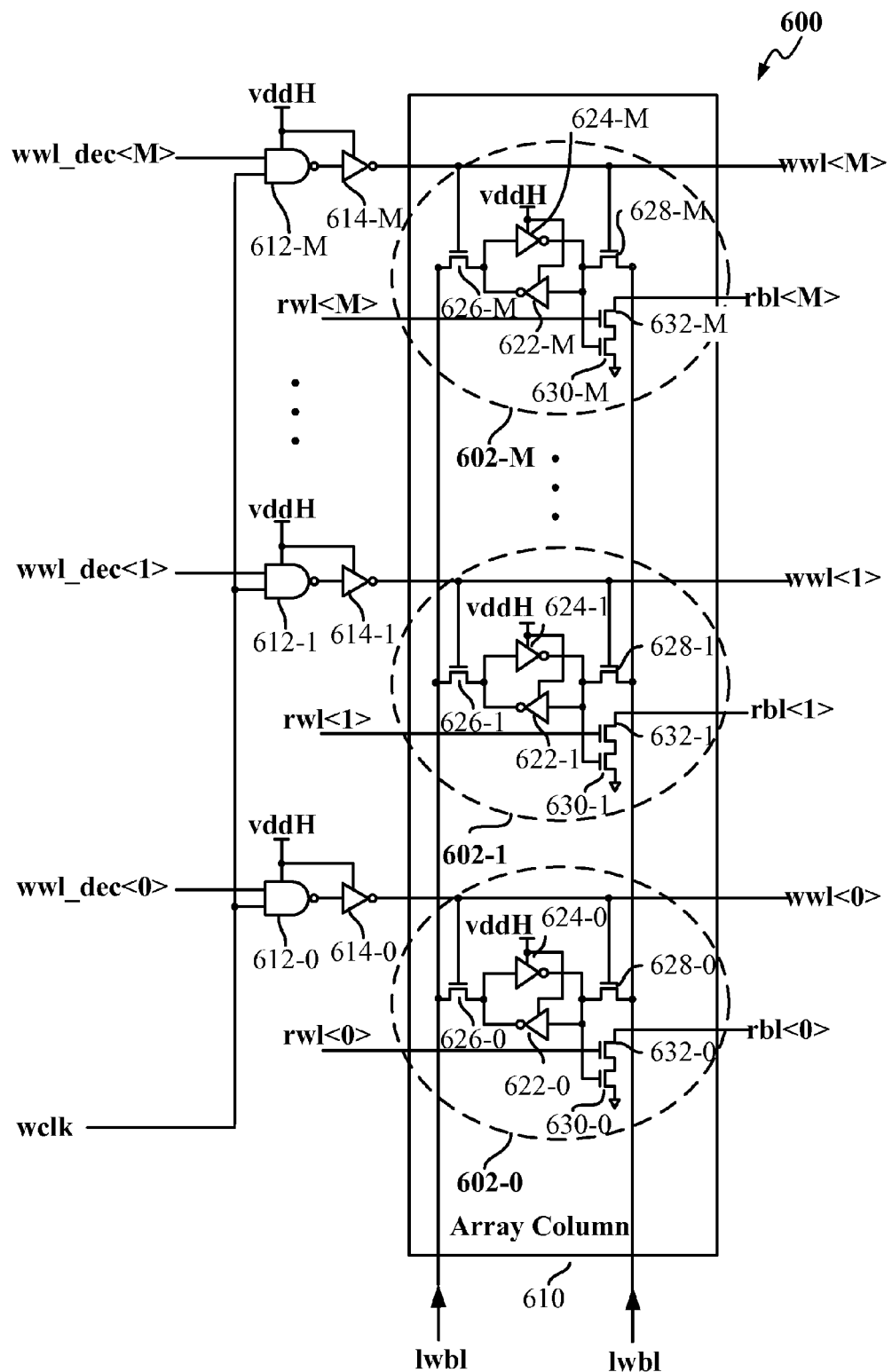
FIG. 6 is a block diagram of a bank of bitcells that may be used with the write driver of FIG. 2.

FIG. 6 illustrates a bank of bitcells 600 that may be coupled to the write driver 200 of FIG. 2 that includes a set of M-bitcells 602-0,M in an array column 610, each of which are coupled to a pair of lwbl/lwblb signal lines such as the pair of lwbl/lwblb signal lines of the write driver 200 in FIG. 2. These bitcells may be conceptualized as the set of bitcells 112-0,M in FIG. 1.

Each bitcell may be addressed by a decoded signal received from a respective write wordline decode line (wwl_dec) signal line (illustrated as "wwl_dec<0>" to "wwl_dec <M>") at a NAND gate 612-0,M that is coupled to an inverter 614-0,M. Each inverter 614-0,M drives a respective pair of transistors 626-0,M; 628-0,M to allow write operations to be performed on a serially coupled pair of inverters 622-0,M; 624-0,M. A value that is stored on a bitcell in the set of M-bitcells 602-0,M may be read using a respective read word line signal line <0>,<M> (illustrated as "rwl<0>" to "rwl<M>") and a respective read bitline signal line <0>,<M> (illustrated as "rbl<0>" to "rwl<M>"), coupled to a transistor 632-0,M and a transistor 630-0,M. Specifically, a value stored in any one of the serially coupled pair of inverters 622-0,M; 624-0,M may be read through addressing a respective transistor 632-0,M that is coupled to transistor 630-0,M. As the operation of the bitcells illustrated in FIG. 6 is conventional in nature, no further description is included herein to avoid unnecessarily complicating the description.

The teachings herein may be incorporated into (e.g., implemented within or performed by) a variety of apparatuses (e.g., devices). For example, one or more aspects taught herein may be incorporated into a memory device for a phone (e.g., a cellular phone), a personal data assistant ("PDA"), an entertainment device (e.g., a music or video device), a headset (e.g., headphones, an earpiece, etc.), a microphone, a medical sensing device (e.g., a biometric sensor, a heart rate monitor, a pedometer, an electrocardiogram device, a smart bandage, etc.), a user I/O device (e.g., a watch, a remote control, a light switch, a keyboard, a mouse, etc.), an environment sensing device (e.g., a tire pressure monitor), a computer, a point-of-sale device, an entertainment device, a hearing aid, a set-top box, or any other suitable device.

Figure 7:
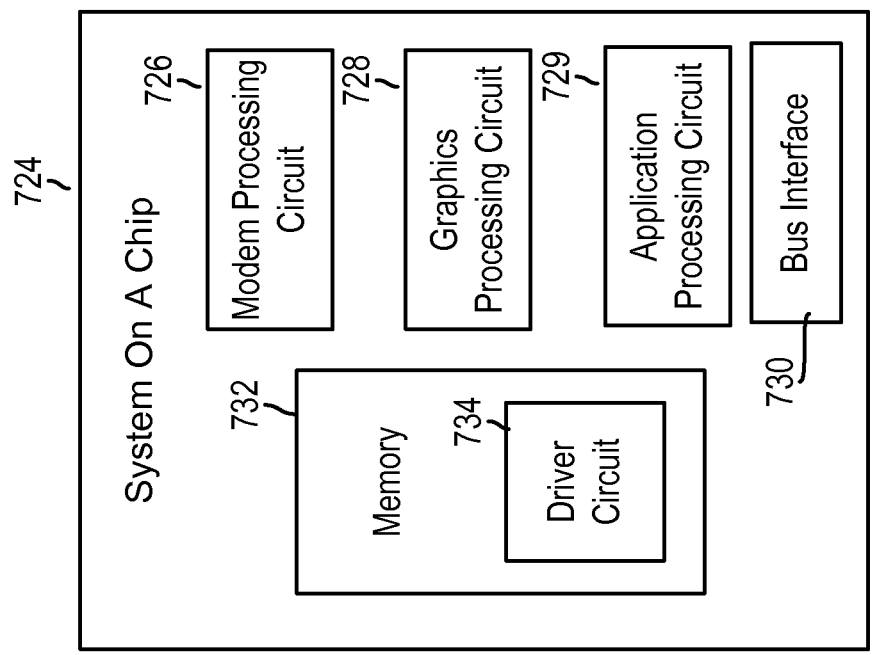
FIG. 7 illustrates two block diagrams of examples of devices in which a high-speed memory write driver circuit with level shifting features may be used.
Figure 7:
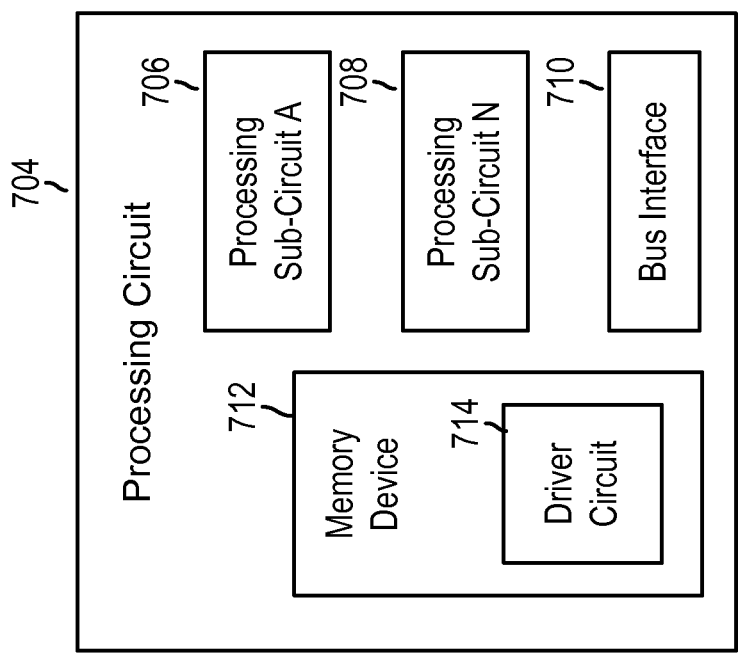

FIG. 7 illustrates two block diagrams of examples of devices in which a high-speed memory write driver circuit with level shifting features may be used.

In a first example, a processing circuit 704 may include one or more processing sub-circuits A to N 706, 708, a bus interface 710 (allowing the processing circuit 704 to communicate with external devices), and a memory device 712 including a write driver circuit 714. The write driver circuit 714 may include a voltage level shifting feature, as illustrated in FIGS. 1-5.

In a second example, a processing circuit 724 may include a modem processing circuit 726, a graphics processing circuit 728, an application processing circuit 729, a bus interface 730 (allowing the system on a chip 724 to communicate with external devices), and a memory device 732 including a write driver circuit 734. The write driver circuit 734 may include a voltage level shifting feature, as illustrated in FIGS. 1-5.

The memory devices 712 and 732 may include volatile memory devices (e.g. Static Random Access Memory SRAM) which are coupled to and/or integrated with the driver circuits 714 and 734, respectively. According to one aspect, all components and/or elements within the processing circuit 704 and/or system on a chip (SOC) may be within the same semiconductor die.

Figure 8:
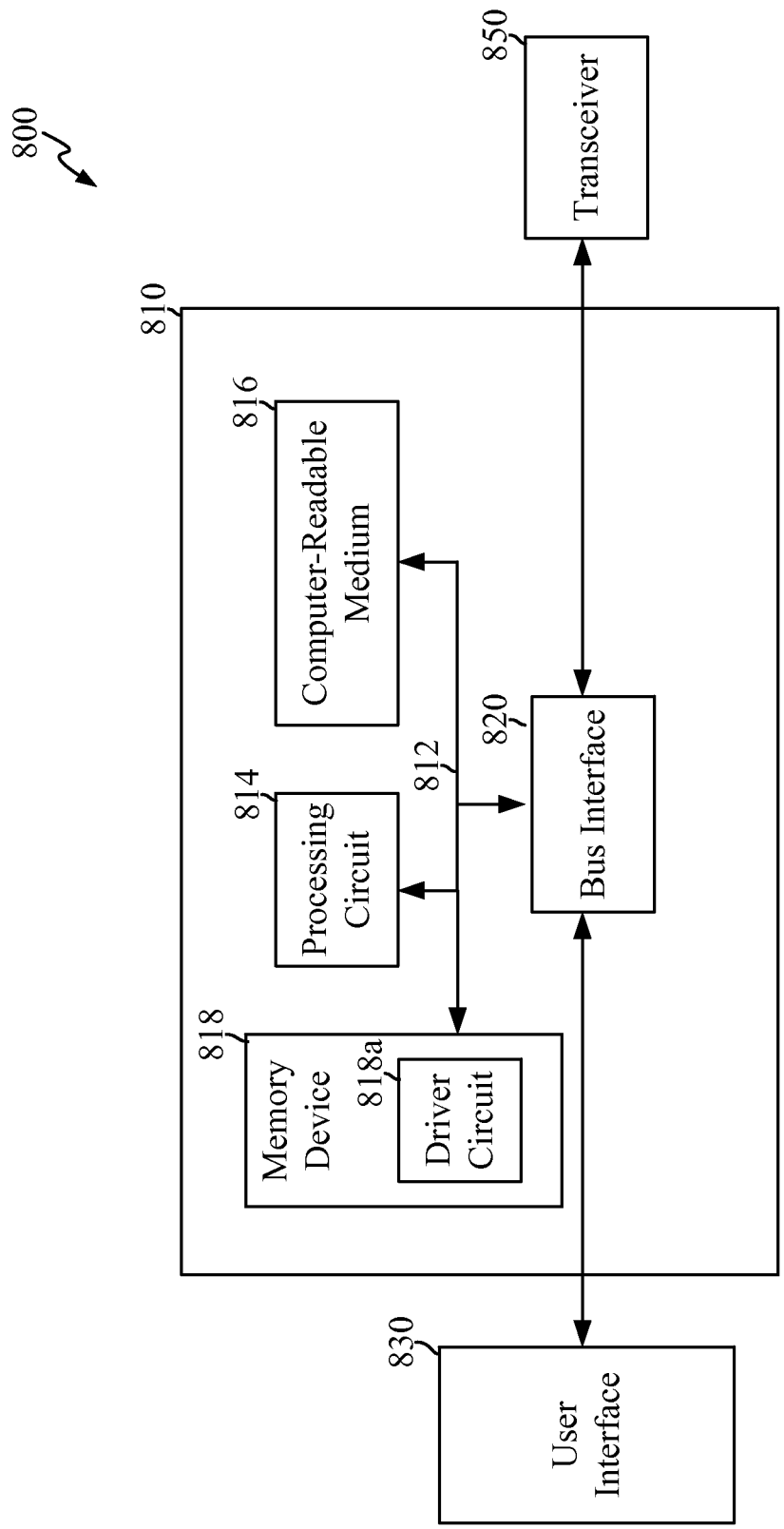
FIG. 8 is a block diagram illustrating an example of a hardware implementation for an apparatus employing a processing system in which a memory device configured in accordance with various aspects of the write driver circuit described herein may be utilized.

FIG. 8 is a block diagram illustrating another example of a hardware implementation for an apparatus 800 employing a processing system 810 that may be used in accordance with various aspects of a high speed write driver with level shifting as described herein. The apparatus 800 is meant to be a generalized representation of a variety of devices that may advantageously use the various aspects of the disclosed approach, either in a cooperative fashion with other devices, or in a standalone fashion. Thus, for example, in accordance with various aspects of the disclosure, an element, any portion of an element, or any combination of elements for use in a communication system, including a wireless node, may be implemented with the processing system 810.

In this example, the processing system 810 may be implemented as having a bus architecture, represented generally by a bus 812. The bus 812 may include any number of interconnecting buses and bridges depending on the specific application of the processing system 810 and overall design constraints. The bus 812 links together various circuits including one or more processing circuits (represented generally by the processing circuit 814), a memory 818, and computer-readable media (represented generally by a computer-readable medium 816). The bus 812 may also link various other circuits such as timing sources, peripherals, voltage regulators, and power management circuits, which are well known in the art, and therefore, will not be described any further. A bus interface 820 provides an interface between the bus 812 and a transceiver 850. The transceiver 850 provides a means for communicating with various other apparatus over a transmission medium. Depending upon the nature of the apparatus, a user interface 830 (e.g., keypad, display, speaker, microphone, joystick) may also be provided.

The processing circuit 814 may be responsible for managing the bus 812 and general processing, including execution of software that may be stored on the computer-readable medium 816 or the memory 818. The computer-readable medium 816 or the memory 818 may also be used for storing data that is manipulated by the processing circuit 814 when executing software.

In one example of the disclosed approach, the processing circuit 814 may be either the processing circuit 704 or the system on a chip 724 of FIG. 7, thereby incorporating volatile memory (e.g., SRAM) and a write driver circuit with level shifting features as illustrated in FIGS. 1-6.

In another example of the disclosed approach, the memory 818 may include integrated/onboard volatile memory (e.g., SRAM) that is coupled to or integrated with a driver 818a, such as the write driver 200 of FIG. 2 (with level shifting features) for performing write operations on bitcells in the memory 818 for storing instructions required for execution of software as well as data.

The software, when executed by the processing circuit 814, causes the processing system 810 to perform the various functions described herein for any particular apparatus. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The computer-readable medium 816 may be a non-transitory computer-readable medium such as a computer-readable storage medium. A computer-readable storage medium may include, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. Although illustrated as residing in the processing system 810, the computer-readable medium 816 may reside externally to the processing system 810, or distributed across multiple entities including the processing system 810. The computer-readable medium 816 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Figure 9:
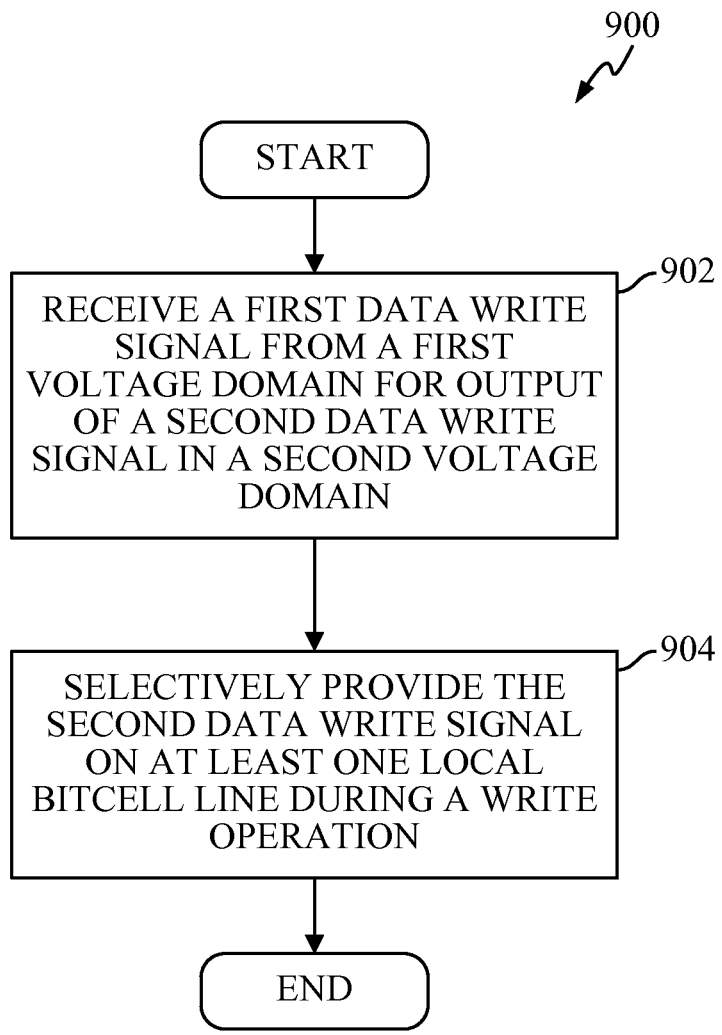
FIG. 9 is a flow diagram illustrating a process that may be performed by the write driver of FIG. 2 in accordance with various aspects of the disclosed approach.

In one configuration, the write driver 200 includes means for shifting a voltage level that is configured to receive a first data write signal WD/WDB (e.g., on a first data write line gwbl 246 and/or gwblb 248) from a first voltage domain (e.g., operating at a first voltage level VddL) and output a second data write signal WD'/WDB' (e.g., on a second data write line lwbl 238 and/or lwblb 240) in a second voltage domain (e.g., at a second voltage level VddH). In one embodiment, these means for shifting a voltage level include the transistors 210, 212 that are coupled to receive signals (e.g., WD 234 and/or WDB 236) from the pair of gwbl/gwblb signal lines 246, 248 at a first voltage level/domain (VddL) and output signals (e.g., voltage-shifted, voltage-conditioned WD and/or WDB) on the pair of lwbl/lwblb signal lines 238, 240 at a second voltage level/domain (e.g., VddH) using the pair of inverter stack 214, 216, which are also part of the means for shifting a voltage level. The write driver 200 may also include means for receiving a write enable signal (e.g., the wclk signal of FIG. 2). In one embodiment, this means for receiving a write enable signal may include transistors 222, 228 that are coupled to the wclk signal line and allow the write driver 200 to operate based on the wclk signal line input. The write driver 200 further includes means for selectively providing the second data write signal WD' 250 and/or WDB 252 on at least one local bitcell line 238, 240, respectively, during a write operation based on the write enable signal 254. In one embodiment, this means includes the NMOS footer transistors 202, 204, 206, and 208 allow the pair of lwbl/lwblb signal lines 238, 240 to be held to a respective rail based on values of the pair of gwbl/gwblb signal lines 246, 248. FIG. 9 illustrates a memory write process 900 that may be used to describe an operation of a write driver such as the write driver 200 that is configured with level shifting features. In one aspect of the disclosed approach, the memory write process 900 includes receiving a first data write signal from a first voltage domain for output of a second data write signal in a second voltage domain at 902. The memory write process 900 further includes selectively providing the second data write signal on at least one local bitcell line during a write operation at 904. As discussed above, the first voltage domain may include a first voltage level that is lower than a second voltage level of the second voltage domain. The memory write process 900 provides for the at least one local bitcell line to remain in a floating state when there is no write operation.

Various aspects of the disclosed approach provide for a fast, energy efficient write driver for operation in a dual-voltage domain memory architecture. Specifically, various aspects of the write driver described herein combine a high speed driver with voltage level shifting capabilities that may be implemented efficiently in reducing use of silicon area while using lower power. The proposed write driver may provide better speed, which may be as low as on the order of only one gate delay during the critical bitline low transition. The proposed write driver may also use less dynamic power, which may be about 50% less dynamic power compared to typical pre-charged bitlines schemes. Further, the proposed write driver may also suffer less leakage through use of floating write bitlines because no active power is being used to maintain write bitlines at a particular rail. As noted previously, the use of floating write bitlines and other nodes allow power savings without compromising speed of writeability.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processing circuit") such the processing circuit can read information (e.g., code) from and write information to the storage medium. A sample storage medium may be integral to the processor. The processing circuit and the storage medium may reside in an ASIC. The ASIC may reside in user equipment. In the alternative, the processing circuit and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Also, it should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Unless specifically stated otherwise, the term "some" refers to one or more. A phrase referring to "at least one of" a list of items refers to any combination of those items, including single members. As an example, "at least one of: A, B, or C" is intended to cover: A; B; C; A and B; A and C; B and C; and A, B and C.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A memory data write circuit, comprising:
   a level shifter circuit configured to receive at least one first data write signal from at least one global bitline in a first voltage domain and output at least one second data write signal in a second voltage domain; and
   a write driver circuit coupled to the level shifter circuit and a plurality of memory bitcells through at least one local bitcell line, wherein the write driver circuit is configured to selectively provide the at least one second data write signal on the at least one local bitcell line during a write operation.

2. The memory data write circuit of claim 1, wherein the first voltage domain comprises a first voltage level that is lower than a second voltage level of the second voltage domain.

3. The memory data write circuit of claim 1, wherein the write driver circuit is further configured to allow the at least one local bitcell line to remain in a floating state.

4. The memory data write circuit of claim 3, wherein the write driver circuit is further coupled to a write clock line and configured to allow the at least one local bitcell line to remain in the floating state when a write clock line is inactive.

5. A memory data write circuit, comprising:
   a level shifter circuit configured to receive at least one first data write signal from a first voltage domain and output at least one second data write signal in a second voltage domain; and
   a write driver circuit coupled to the level shifter circuit and a plurality of memory bitcells through at least one local bitcell line, wherein the write driver circuit is configured to selectively provide the at least one second data write signal on the at least one local bitcell line during write operation;
   wherein the level shifter comprises at least one set of stacked inverter transistors comprising a p-channel metal-oxide-semiconductor (PMOS) transistor coupled in series to an n-channel metal-oxide-semiconductor (NMOS) transistor with the at least one local bitcell line coupled between the PMOS transistor and the NMOS transistor, the at least one set of inverter transistors having one end coupled to a power supply voltage and a second end, and
   wherein the write driver circuit comprises a footer transistor configured to selectively enable or disable a path between the second end of the at least one set of stacked inverter transistors and ground depending on a state of a write clock line.

6. A memory data write circuit, comprising:
   a level shifter circuit configured to receive a first pair of data write signals from a first voltage domain and output a second pair of data write signals in a second voltage domain; and
   a write driver circuit coupled to the level shifter circuit and a plurality of memory bitcells through first and second local bitcell lines, wherein the write driver circuit is configured to selectively provide one of the data write signals in the second pair of data write signals on the first local bitcell line and another one of the data write signals in the second pair of data write signals on the second local bitcell line during a write operation;
   wherein the level shifter circuit comprises:
     a first set of stacked inverter transistors comprising a first p-channel metal-oxide-semiconductor (PMOS) transistor coupled in series to a first n-channel metal-oxide-semiconductor (NMOS) transistor with the first local bitcell line coupled between the first PMOS transistor and the first NMOS transistor of the first set of stacked inverter transistors, the first set of staked inverter transistors having one end coupled to a power supply voltage and a second end; and
     a second set of stacked inverter transistors comprising a second PMOS transistor coupled in series to a second NMOS transistor with the second local bitcell line coupled between the second PMOS transistor and the second NMOS transistor of the second set of stacked inverter transistor, the second set of staked inverter transistors having one end coupled to the power supply voltage and a second end;
   wherein the second ends of the first set of stacked inverter transistors and second set of stacked inverter transistors are coupled together to achieve charge sharing between the first and second sets of stacked inverter transistors.

7. The memory data write circuit of claim 1, wherein the write driver circuit is further configured to provide the at least one second data write signal on the at least one local bitcell line when a write enable signal is received on a write clock line.

8. The memory data write circuit of claim 1, wherein the write driver circuit further comprises a cross-coupled p-channel metal-oxide-semiconductor (PMOS) transistor circuit.

9. The memory data write circuit of claim 1, wherein the at least one local bitcell line comprises a pair of complementary local write bitlines.

10. The memory data write circuit of claim 9, wherein each bitline in the pair of complementary local write bitlines is pulled to one of a pair of opposing rails of the second voltage domain through a corresponding inverter p-channel metal-oxide-semiconductor (PMOS) and n-channel metal-oxide-semiconductor (NMOS) transistor stack.

11. The memory data write circuit of claim 10, wherein the second voltage domain comprises a power supply voltage and the pair of opposing rails comprises a ground and the power supply voltage.

12. An apparatus comprising:
   means for level shifting at least one first data write signal received from at least one global bitline in a first voltage domain to output at least one second data write signal in a second voltage domain; and
   means for selectively providing the at least one second data write signal to a plurality of memory bitcells through at least one local bitcell line coupled to the means for level shifting during a write operation.

13. The apparatus of claim 12, wherein the first voltage domain comprises a first voltage level that is lower than a second voltage level of the second voltage domain.

14. The apparatus of claim 12, further comprising means for allowing the at least one local bitcell line to remain in a floating state.

15. The apparatus of claim 14, wherein the means for selectively providing the at least one second data write signal is coupled to a write clock line and the means for allowing the at least one local bitcell line to remain in the floating state comprises means for allowing the at least one local bitcell to remain in the floating state when a write clock line is inactive.

16. The apparatus of claim 12, further comprising means for providing the at least one second data write signal on the at least one local bitcell line when a write enable signal is received on a write clock line.

17. The apparatus of claim 12, wherein the means for selectively providing the at least one second data write signal comprises a cross-coupled p-channel metal-oxide-semiconductor (PMOS) transistor circuit.

18. The apparatus of claim 12, wherein the at least one local bitcell line comprises a pair of complementary local write bitlines.

19. The apparatus of claim 18, further comprising means for pulling each bitline in the pair of complementary local write bitlines to one of a pair of opposing rails of the second voltage domain.

20. The apparatus of claim 19, wherein the means for pulling each bitline in the pair of complementary local write bitlines to one of the pair of opposing rails of the second voltage domain comprises a pair of corresponding inverter p-channel metal-oxide-semiconductor (PMOS) and n-channel metal-oxide-semiconductor (NMOS) transistor stacks.

21. The apparatus of claim 20, wherein the second voltage domain comprises a power supply voltage and the pair of opposing rails comprises a ground and the power supply voltage.

22. An apparatus for wireless communication, comprising:
at least one processing circuit; and
a memory coupled to the at least one processing circuit, the memory comprising a memory data write circuit comprising:
a level shifter circuit configured to receive at least one first data write signal at least one global bitline in from a first voltage domain and output at least one second data write signal in a second voltage domain; and
a write driver circuit coupled to the level shifter circuit and a plurality of memory bitcells through at least one local bitcell line, wherein the write driver circuit is configured to selectively provide the at least one second data write signal on the at least one local bitcell line during a write operation.

23. The apparatus of claim 22, wherein the first voltage domain comprises a first voltage level that is lower than a second voltage level of the second voltage domain.

24. The apparatus of claim 22, wherein the write driver circuit is further configured to allow the at least one local bitcell line to remain in a floating state.

25. The apparatus of claim 24, wherein the write driver circuit is further coupled to a write clock line and configured to allow the at least one local bitcell line to remain in the floating state when a write clock line is inactive.

26. A method of wireless communication comprising:
receiving at least one first data write signal from at least one global bitline in first voltage domain for output of at least one second data write signal in a second voltage domain; and
selectively providing the at least one second data write signal on at least one local bitcell line during a write operation.

27. The method of claim 26, wherein the first voltage domain comprises a first voltage level that is lower than a second voltage level of the second voltage domain.

28. The method of claim 26, further comprising allowing the at least one local bitcell line to remain in a floating state.

29. The method of claim 26, further comprising:
receiving a write enable signal; and
providing the at least one second data write signal on the at least one local bitcell line based on the write enable signal.

30. The method of claim 26, wherein the at least one local bitcell line comprises a pair of complementary local write bitlines, the method further comprising pulling each bitline in the pair of complementary local write bitlines to one of a pair of opposing rails of the second voltage domain through a corresponding inverter p-channel metal-oxide-semiconductor (PMOS) and n-channel metal-oxide-semiconductor (NMOS) transistor stack.

31. The method of claim 30, wherein the second voltage domain comprises a power supply voltage and the pair of opposing rails comprises a ground and the power supply voltage.

32. The memory data write circuit of claim 1, further comprising an inverter coupled to the at least one global bitline, wherein the inverter is configured to receive the at least one first data write signal and output the at least one first data write signal on the at least one global bitline in the first voltage domain.

33. The memory data write circuit of claim 32, wherein the inverter is powered by a first power supply voltage and the level shifter circuit is powered by a second power supply voltage, and the first power supply voltage is lower than the second power supply voltage.

34. The memory data write circuit of claim 6, wherein the write driver circuit further comprises a footer transistor configured to selectively enable or disable a path between the second end of the first set of stacked inverter transistors and ground depending on a state of a write clock line.

35. The memory data write circuit of claim 6, wherein the write driver circuit further comprises a write-enable transistor configured to selectively enable or disable a path between the power supply voltage and gates of the first NMOS and PMOS transistors depending on a state of a write clock line.

36. The memory data write circuit of claim 6, wherein the level shifter circuit further comprises a third NMOS transistor having a drain coupled to gates of the first NMOS and PMOS transistors and a gate coupled to a global bitline for receiving one of the write data signals in first pair of data write signals, and the write driver circuit comprises a footer transistor configured to selectively enable or disable a path between a source of the third NMOS transistor and ground depending on a state of a write clock line.

* * * * *